(12) United States Patent
Hunt (10) Patent No.: US 6,950,683 B2
(45) Date of Patent: Sep. 27, 2005

(54) BATTERY LIFE INDICATION (75) Inventor: Allan Hunt, Reading (GB)

(73) Assignee: Nokia Mobile Phones Limited, Espoo (FI)

( * ) Notice: Subject to any disclaimer, the term of this patent is extended or adjusted under 35 U.S.C. 154(b) by 639 days.

(21) Appl. No.: 09/741,205

(22) Filed: Dec. 19, 2000

(65) Prior Publication Data
US 2001/0006906 A1 Jul. 5, 2001

(30) Foreign Application Priority Data
Dec. 22, 1999 (GB) .............................................. 9930447

(51) Int. Cl.⁷ .............................................. H04M 1/00
(52) U.S. Cl. ..................... 455/572; 455/573; 455/550.1
(58) Field of Search ................................. 455/572, 573, 455/566, 127.1, 552.1, 127.4; 320/118, 124, 127, 130, 134, 135, 136

(56) References Cited

U.S. PATENT DOCUMENTS

| 3,934,188 A | | 1/1976 | York ............................ 320/48 |
| 5,570,025 A | * | 10/1996 | Lauritsen et al. ........... 324/433 |
| 5,596,260 A | | 1/1997 | Moravec et al. .............. 320/30 |
| 5,838,140 A | * | 11/1998 | Rosenthal .................... 320/133 |
| 5,895,440 A | * | 4/1999 | Proctor et al. ................ 702/63 |
| 6,114,838 A | * | 9/2000 | Brink et al. ................ 320/136 |
| 6,307,377 B1 | * | 10/2001 | Cummings et al. ......... 324/427 |
| 6,314,307 B1 | * | 11/2001 | Charron ...................... 455/573 |
| 6,463,305 B1 | * | 10/2002 | Crane ......................... 455/566 |

FOREIGN PATENT DOCUMENTS

| EP | 0 803 959 | 10/1997 |
| GB | 2312517 A | 10/1997 |

* cited by examiner

Primary Examiner—Temica Beamer
(74) Attorney, Agent, or Firm—Ohlandt, Greeley, Ruggiero & Perle L.L.P.

(57) ABSTRACT

A method of indicating extant battery life has the steps of initially determining a first extant battery life value having a first confidence level and generating a perceivable indication of the first battery life value. The method also has the step of determining a second extant battery life value having a second confidence level and generating a perceivable indication of the second battery life value after generating the perceivable indication of the first battery life value. The second confidence level is higher than the first confidence level and the determination of the first extant battery life value is completed before the determination of the second extant battery life value is completed.

48 Claims, 5 Drawing Sheets

BATTERY LIFE INDICATION

FIELD OF THE INVENTION

The present invention relates to the indication of extant battery life.

BACKGROUND OF THE INVENTION

Mobile telephones are an example of a battery-powered device familiar to most people. The extant battery life of battery-power devices, including mobile telephones, is of considerable importance to their users. Consequently, the provision of extant battery life indicators on mobile telephones is universal.

One method of determining the extant battery life of an apparatus, such as a mobile telephone, is to measure the battery voltage and then read an extant battery life value from a pre-programmed lookup table. This has the advantage of being relatively simple to implement but suffers from a lack of accuracy.

This problem is addressed in GB-A-2312517 which describes taking three voltage readings, fitting a discharge curve to the readings and then determining the extant battery life from the curve fitted to the readings. This approach is more accurate than the earlier lookup table technique.

However, the technical considerations for battery-powered apparatus include meeting users' expectations for the man-machine interface beyond merely providing information accurately. A problem therefore arises with the approach to extant battery life determination described in GB-A-2312517 in that the result is not available for several minutes after the first voltage reading is taken. This has been found to be unsatisfactory with users and the delay can be interpreted by users as indicating a "flat" battery.

The technique of GB-A-2312517 also may not respond quickly enough if the current drain on a battery is high, e.g. when a mobile telephone is in active mode.

SUMMARY

It is an object of the present invention to solve or at least ameliorate the aforementioned problems. It will be appreciated that the present invention is applicable in cases where slow extant battery life determining techniques other than that disclosed in GB-A-2312517 are used.

According to the present invention, there is provided a method of indicating extant battery life, the method comprising the steps of:
 (a) initially determining a first extant battery life value having a first confidence level;
 (b) generating a perceivable indication of said first battery life value;
 (c) determining a second extant battery life value having a second confidence level; and
 (d) generating a perceivable indication of said second battery life value after generating the perceivable indication of said first battery life value,
 wherein the second confidence level is higher than said first confidence level and said determination of said first extant battery life value is completed before said determination of said second extant battery life value is completed.

According to the present invention, there is also provided a method of indicating extant battery life for a battery powered apparatus, the method comprising the steps of:
 (a) determining a first extant battery life value having a first confidence level during operation of an apparatus in a first mode;
 (b) generating a perceivable indication of said first battery life value;
 (c) determining a second extant battery life value having a second confidence level during operation of an apparatus in a second mode; and
 (d) generating a perceivable indication of said second battery life value after generating the perceivable indication of said first battery life value,
 wherein the second confidence level is higher than said first confidence level and said first mode places a greater current demand on the battery than the second mode.

According to the present invention, there is further provided a battery-powered apparatus including a battery, voltage sensor configured to sense the output voltage of the battery, an indicator and a processor for controlling the indicator to indicate the extant life of the battery in dependence on the output of the voltage sensor, wherein the processor is configured to:
 (a) initially determine a first extant battery life value having a first confidence level on the basis of the output of the voltage sensor;
 (b) control the indicator to indicate said first battery life value;
 (c) determine a second extant battery life value having a second confidence level, higher than the first confidence level, on the basis of the output of the sensor; and
 (d) control the indicator to indicate said second battery life value after indication of said first battery life value, and
said determination of said first extant battery life value is completed before said determination of said second extant battery life value is completed.

According to the present invention, there is still further provided a battery-powered apparatus including terminals for connections to a battery, voltage sensor configured to sense the output voltage of a battery connected to said terminals, an indicator and a processor for controlling the indicator to indicate the extant life of a battery, connected to said terminals, in dependence on the output of the voltage sensor, wherein the processor is configured to:
 (a) determine a first extant battery life value having a first confidence level on the basis of the output of the voltage sensor when the apparatus is operating in a first mode;
 (b) control the indicator to indicate said first battery life value;
 (c) determine a second extant battery life value having a second confidence level higher than the first confidence level, on the basis of the output of the sensor when the apparatus is operating in a second mode; and
 (d) control the indicator to indicate said second battery life value after indication of said first battery life value, and
said second mode is characterised by a higher current demand being placed on the battery powering the apparatus than that placed on the battery by said first mode.

Thus, the user of an apparatus in which the present invention is embodied is presented with a extant battery life indication, having some validity, instantaneously when the apparatus is switched on or otherwise activated.

The processor of an apparatus according to the present invention will generally be constructed or programmed as necessary to provide the preferred and optional features set out below. The term "processor" includes, but not exclusively so, the combination of a cpu (central processing unit) and a memory storing program data for controlling the operation of the cpu.

Preferably, the manner of indicating the second battery life value is different from the manner of indicating the first battery life value so that the user is made aware of the confidence that can be placed in the displayed extant battery life and when the more accurate value has been determined.

Conveniently, the first and second battery life values are indicated visually, e.g. by a display device under the control of a processor. However, the indication could be made audibly, for instance in apparatus for blind or partially sighted users.

Preferably, the first extant battery life value is determined on an average, e.g. the mean, of a plurality of battery voltage readings. The first extant battery life value may be read from a lookup table in dependence on said average.

The second extant battery life value is determined on the basis of a plurality of time-spaced battery voltage readings, the first, and preferably the second, of which may be used for producing the first extant battery life value. Preferably, the period between the first and last of said time-spaced readings is in the range 15 seconds to 10 minutes; more preferably about 30 seconds.

Preferably, said second extant battery life value is calculated on the basis of three voltage readings according to the formula:

$$t = \frac{\ln\left(\frac{(\Phi - V_T)}{\xi}\right)}{\ln \alpha}$$

where:

$$\alpha = e^{\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

The present invention may be usefully embodied in a mobile telephone, a portable CD player, a personal digital assistant or the like.

DETAILED DESCRIPTION OF THE PREFERRED EMBODIMENTS

Embodiments of the present invention will now be described, by way of example, with reference to the accompanying drawings.

Figure 1:
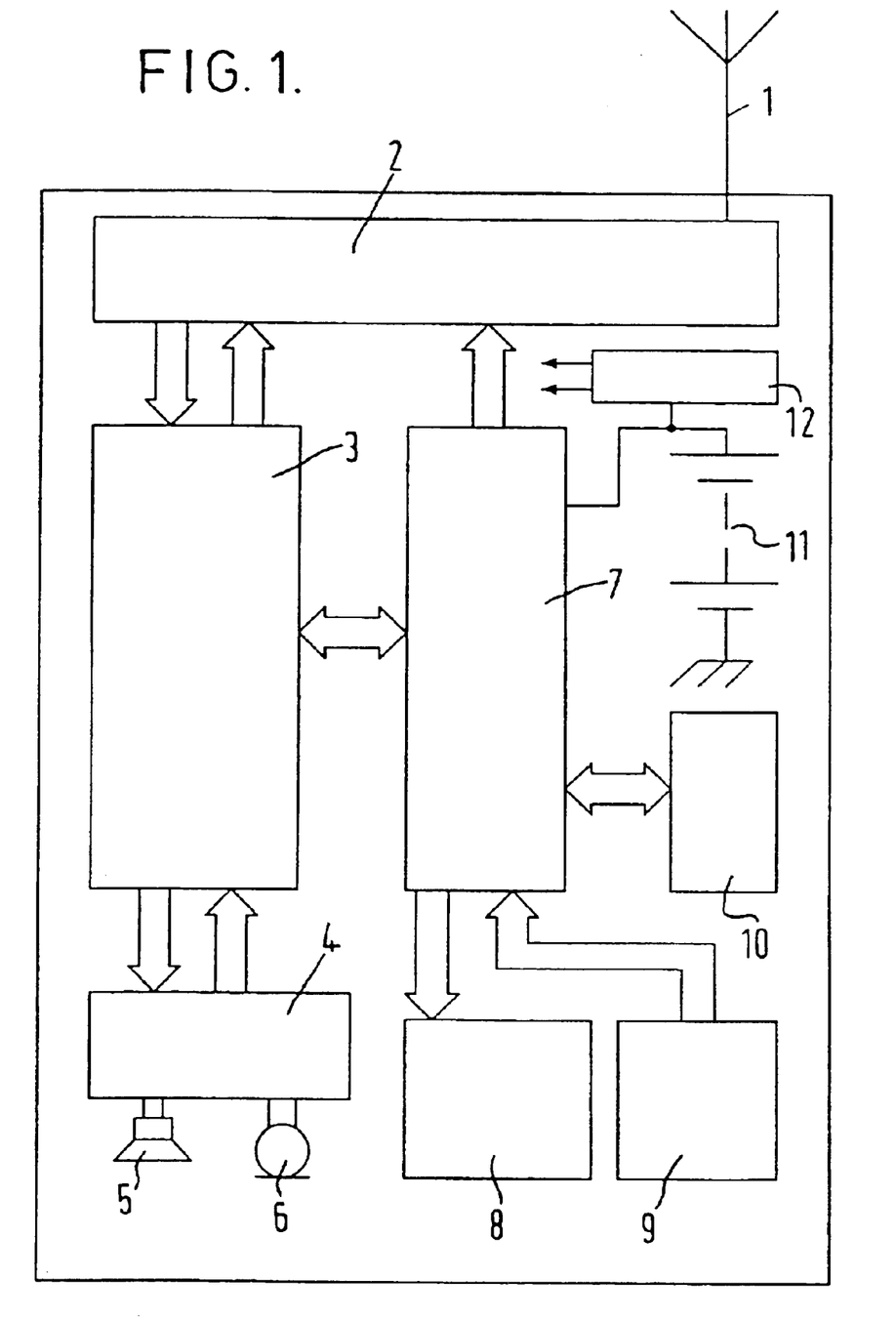
FIG. 1 is a block diagram of a mobile telephone according to the present invention.

Referring to FIG. 1, a mobile telephone comprises an antenna 1, an rf subsystem 2, a baseband DSP (digital signal processing subsystem 3, an analogue audio subsystem 4, a loudspeaker 5, a microphone 6, a controller 7, a liquid crystal display 8, a keypad 9, memory 10, a battery 11 and a power supply circuit 12.

The rf subsystem 2 contains if and rf circuits of the mobile telephone's transmitter and receiver and a frequency synthesiser for tuning the mobile telephone's transmitter and receiver. The antenna 1 is coupled to the rf subsystem 2 for the reception and transmission of radio waves.

The baseband DSP subsystem 3 is coupled to the rf subsystem 2 to receive baseband signals therefrom and for sending baseband modulation signals thereto. The baseband DSP subsystems 3 includes codec functions which are well-known in the art.

The analogue audio subsystem 4 is coupled to the baseband DSP subsystem 3 and receives de modulated audio therefrom. The analogue audio subsystem 4 amplifies the demodulated audio and applies it to the loudspeaker 5. Acoustic signals, detected by the microphone 6, are pre-amplified by the analogue audio subsystem 4 and sent to the baseband DSP subsystem 4 for coding.

The controller 7 controls the operation of the mobile telephone. It is coupled to the rf subsystem 2 for supplying tuning instructions to the frequency synthesiser and to the baseband DSP subsystem for supplying control data and management data for transmission. The controller 7 operates according to a program stored in the memory 10. The memory 10 is shown separately from the controller 7. However, it may be integrated with the controller 7. A timer for triggering interrupts is also provided by the controller 7.

The display device 8 is connected to the controller 7 for receiving control data and the keypad 9 is connected to the controller 7 for supplying user input data signals thereto.

The battery 11 is connected to the power supply circuit 12 which provides regulated power at the various voltages used by the components of the mobile telephone. The positive terminal of the battery 11 is connected to an analogue-to-digital converter (ADC) input of the controller 7.

The operation of the mobile telephone, insofar as it relates to the present invention, will now be described.

Figure 2:
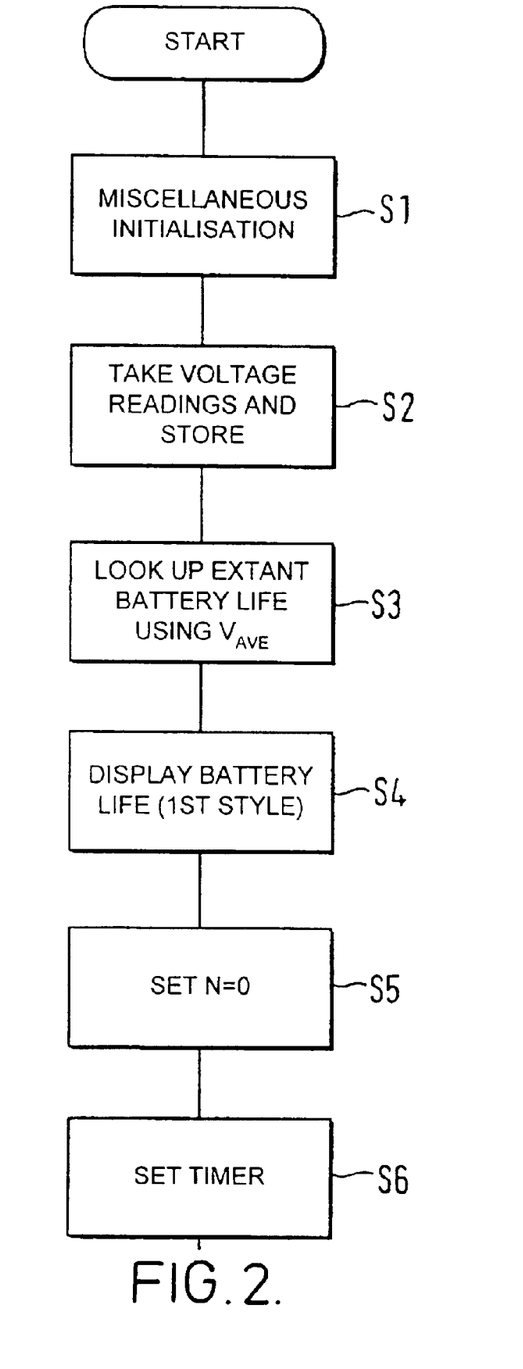
FIG. 2 is a flowchart illustrating the initialisation of the mobile telephone of FIG. 1.

Referring to FIG. 2, when the mobile telephone is switched on, the controller 7 performs various initialisation routines (step S1) as is common in the art. Following the conventional initialisation routines, the controller 7 takes a voltage reading from the ADC and stores it in the third element $V_2$ of a three-element array $V_0$, $V_1$, $V_2$, multiplies it by eight and stores the result in a "average" voltage memory location $V_{AVE}$ (step S2).

The value in the "average" voltage memory location $V_{AVE}$ is used (step S3) to obtain an extant battery life value from a lookup table stored in the memory 10. The controller 7 then controls the display device 8 to display the extant battery life value obtained from the lookup table (step S4).

After the extant battery life value has been displayed (step S4), the controller 7 sets a flag F to false (steps S5) and sets the timer (step S6) so that it will trigger an interrupt after 15 seconds. The mobile telephone will now operate substantially normally until the timer triggers an interrupt.

Figure 3:
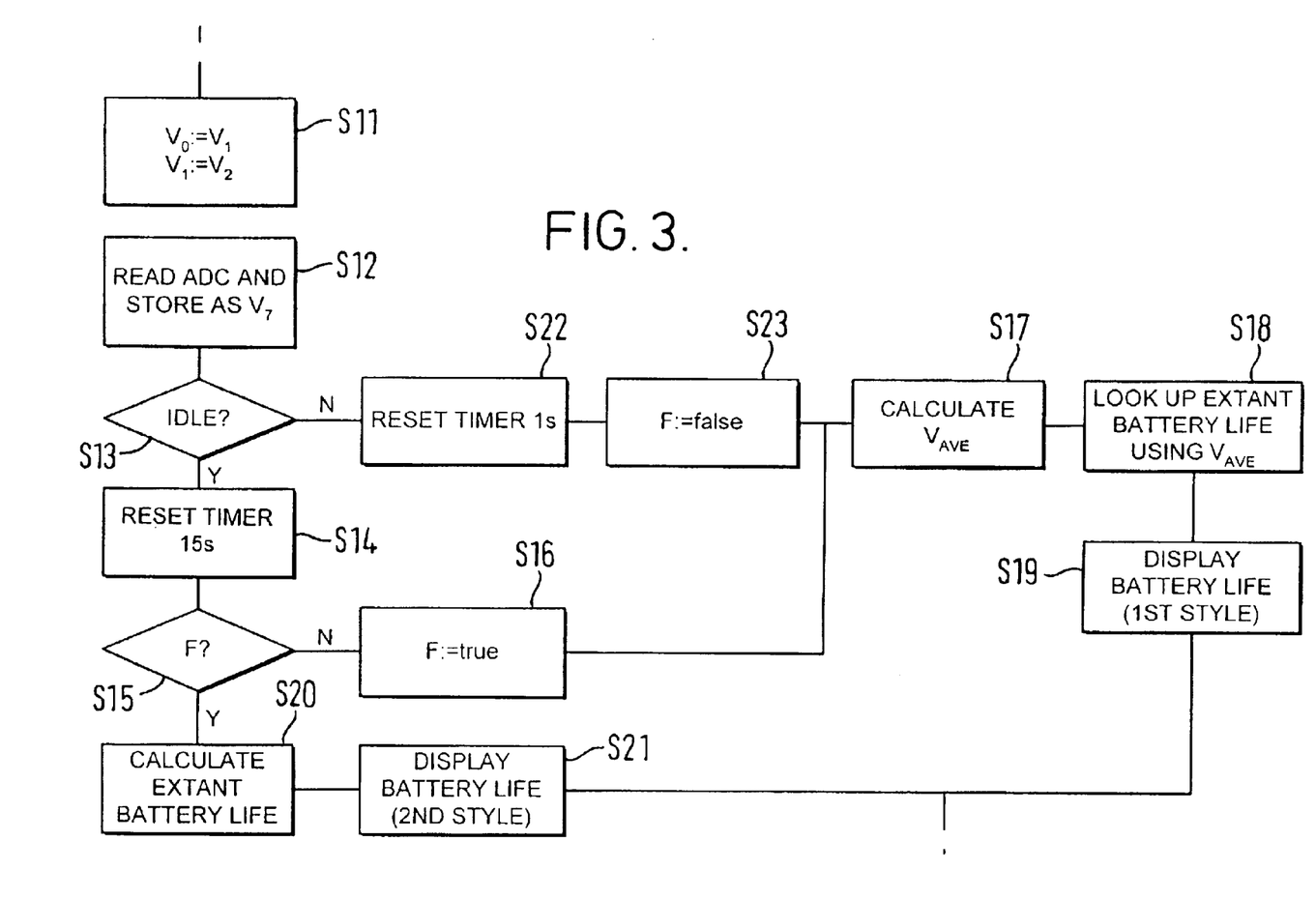
FIG. 3 is a flowchart illustrating an extant battery life determining routine of the mobile telephone of FIG. 1.

Referring to FIG. 3, when the controller 7 enters the interrupt routine on the timer timing out, it assigns the contents of the second array element $V_1$ to the first array element $V_0$, and the contents of the third array element $V_2$ to the second array element $V_1$ (step S11). Then, the controller 7 reads the ADC and assigns its output, i.e. a new battery voltage sample, to the newly vacated element third element $V_2$ of the array (step S12).

After reading the ADC, the controller 7 determines whether the mobile telephone is in idle mode (step S13). If the mobile telephone is in idle mode, the controller 7 resets the timer so that it will time out after 15 s (step S14). The controller 7 then determines whether the flag F is set to true (step S15). If not, the controller 7 sets the flag F to true (step S16), multiplies the contents of the "average" voltage memory location $V_{AVE}$ by ⅞ and adds the new reading, stored in the third element $V_2$ of the array, (step S17), obtains an extant battery life value from the lookup table using the mean $V_{AVE}$ (step S18) and displays the extant battery life value obtained using the display device 8 and the first style (step S19). The controller 7 then exits the routine.

If the flag F is true at step S15, the controller 7 calculates an extant battery life value using the last three voltage readings, which are stored in the elements $V_0$, $V_1$, $V_2$ of the array (step S20) and causes the display device 8 to display the calculated value using a second style (step S21). The controller 7 then exits the routine.

If the mobile telephone is in active mode at step S13, the controller 7 resets the timer to time out after 1 s (step S22) and sets the flag F to false (step S23) before moving on to step S17.

The calculations performed at step S20 are defined by:

$$t = \frac{\ln\left(\frac{(\Phi - V_T)}{\xi}\right)}{\ln \alpha}$$

where:

$t$ is the extant battery life value, $$\alpha = e^{\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is period of the timer triggering the interrupt and $V_T$ is the minimum acceptable battery voltage.

Figure 4:
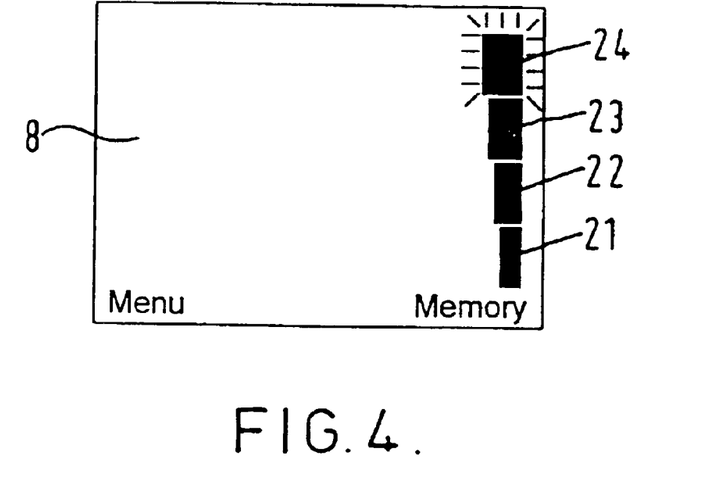
FIG. 4 shows a first display style of a first example of a manner of extant battery life indication according to the present invention.
Figure 5:
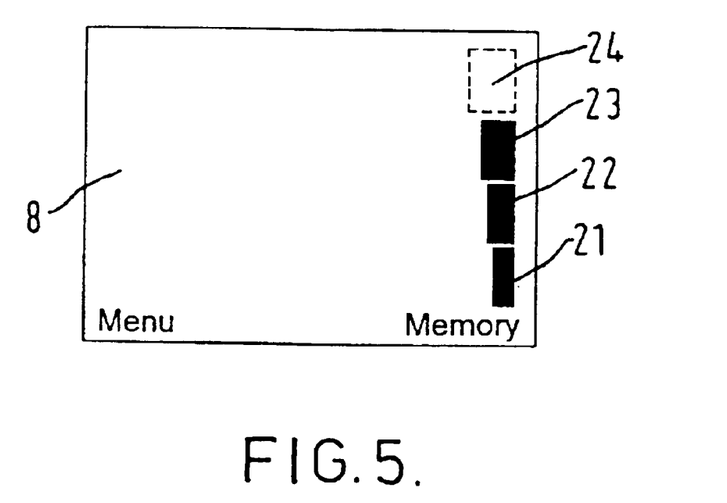
FIG. 5 shows a second display style of a first example of a manner of extant battery life indication according to the present invention.

Regarding the display steps S19 and S21, the controller 7 need take no action if the display device 8 is already displaying the correct value which will often be the case where the extant battery life display has a low resolution, as shown in FIGS. 4 and 5.

Thus, the mobile telephone initially takes a voltage reading, multiplies it by eight or left-shifts it three-times to produce a pseudo average value, and uses the pseudo average to determine extant battery life using the low confidence level lookup table technique. This means that a meaningful display of extant battery life can be presented quickly. If the mobile telephone remains in idle mode, the extant battery life value is determined one more time using the lookup table technique but thereafter the mobile telephone has sufficient data to calculate an extant battery life value with a higher confidence level. In active mode, which produces a larger current demand on the battery, the lookup table technique is again employed. However, the voltage is read every second and the pseudo average is obtained by taking ⅞ of the existing value and adding the new reading.

When switching from active mode to idle mode, the mobile telephone will again use the lookup table for determining the first extant battery life value required after entering idle mode.

In the foregoing description, the operation of the mobile telephone in two modes, an active mode, i.e. in a call, and an idle mode, i.e. not in a call, has be described. However, these modes may be subdivided and additional combinations of battery voltage reading intervals and extant battery life determination techniques used.

The optimal battery voltage reading intervals will differ for different batteries and current demands and will need to be determined empirically.

In the foregoing description, reference has been made to displaying the extant battery life using first and second styles. Exemplary preferred styles will now be described.

Referring to FIG. 4, the extant battery level indication produced at step S17 in a first example is shown in the right-hand side of the display device 8. The indicator comprises four sections 21, 22, 23, 24 of increasing width, one above another. The extant battery life is indicated by darkening sections 21, 22, 23 up to a level corresponding to the extant battery life, determined at step S18, and causing the section or sections 24 above to flash.

Referring to FIG. 5, the corresponding second style comprises darkening sections 21, 22, 23 up to a level corresponding to the more accurately determined extant battery life, determined at step S20, and causing the section or sections 24 above to be invisible.

Figure 6:
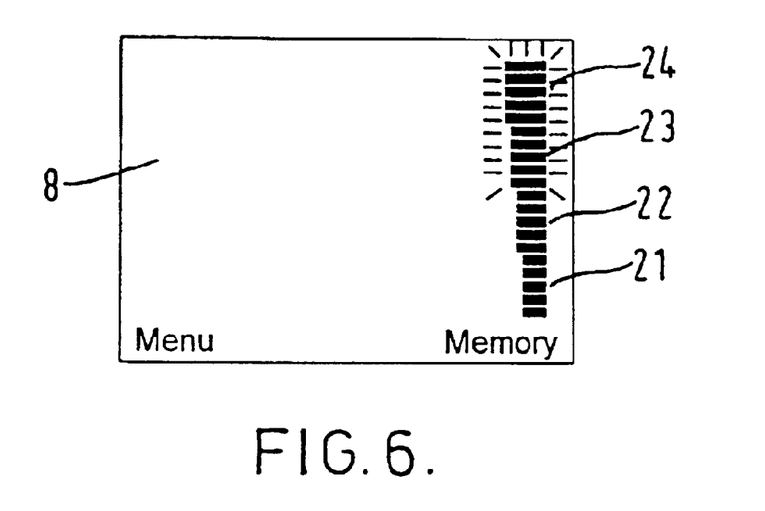
FIG. 6 shows a first display style of a second example of a manner of extant battery life indication according to the present invention.

Referring to FIG. 6, the extant battery level indication produced at step S17 in a first example is shown in the right-hand side of the display device 8. The indicator comprises four sections 21, 22, 23, 24 of increasing width, one above another, each of which is divided into five subsections. The extant battery life is indicated by darkening all the subsections of the sections 21, 22, 23 up to a level corresponding to the extant battery life, determined at step S18, and causing all of the subsections of the section or sections 24 above to flash.

Figure 7:
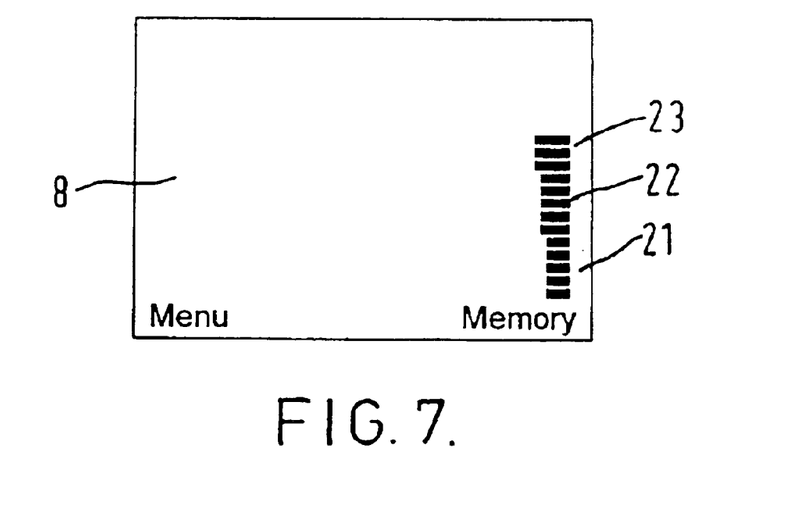
FIG. 7 shows a second display style of a second example of a manner of extant battery life indication according to the present invention.

Referring to FIG. 7, the corresponding second style comprises darkening the subsections of sections 21, 22, 23 up to the subsection corresponding to the more accurately determined extant battery life, determined at step S20, and causing subsections above to be invisible. In the present example, only the three lower subsections of the third section 23 are darkened. Thus, the second style provides greater precision as well as greater accuracy.

It will be appreciated that many other contrasting styles could be used, for instance different colors could be employed or the flashing sections could be replaced with empty, rather than filled, boxes.

It will be appreciated that the foregoing are merely preferred examples and that many modifications may be made to the embodiments described herein departing from the spirit and the scope of the claims appended hereto.

What is claimed is:

1. A method of indicating extant battery life, the method comprising the steps of:
   (a) initially determining, over a first duration, a first extant battery life value having a first confidence level;

(b) generating a perceivable indication of said first battery life value;

(c) determining, over a second duration, a second extant battery life value having a second confidence level; and (d) generating a perceivable indication of said second battery life value after generating the perceivable indication of said first battery life value, wherein said second duration is greater than said first duration, the second confidence level is higher than said first confidence level, and said determination of said first extant battery life value is completed before said determination of said second extant battery life value is completed.

2. A method according to claim 1, wherein the manner of indicating the second battery life value is different from the manner of indicating the first battery life value.

3. A method according to claim 1, wherein the first and second battery life values are indicated visually.

4. A method according to claim 1, wherein the first extant battery life value is determined on the basis of an average of a plurality of battery voltage readings.

5. A method according to claim 4, wherein the first extant battery life value is read from a lookup table in dependence on said average.

6. A method according to claim 1, wherein the second extant battery life value is determined on the basis of a plurality of time-spaced battery voltage readings.

7. A method according to claim 6, wherein said second extant battery life value t calculated on the basis of three voltage readings according to the formula:

$$t = \frac{\ln\left(\frac{(\Phi - V_T)}{\xi}\right)}{\ln\alpha}$$

where:

$$\alpha = e^{\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

8. A method according to claim 4, wherein the second extant battery life value is determined on the basis of a plurality of time spaced battery voltage readings and the first of said time spaced readings is used for calculating said average.

9. A method of indicating extant battery life for a battery powered apparatus, the method comprising the steps of:

(a) determining a first extant battery life value having a first confidence level during operation of an apparatus in a first mode;

(b) generating a perceivable indication of said first battery life value;

(c) determining a second extant battery life value having a second confidence level during operation of said apparatus in a second mode; and (d) generating a perceivable indication of said second battery life value after generating the perceivable indication of said first battery life value, wherein the second confidence level is higher than said first confidence level and said first mode places a greater current demand on the battery than the second mode.

10. A method according to claim 9, wherein the manner of indicating the second battery life value is different from the manner of indicating the first battery life value.

11. A method according to claim 9, wherein the first and second battery life values are indicated visually.

12. A method according to claim 9, wherein the first extant battery life value is determined on the basis of an average of a plurality of battery voltage readings.

13. A method according to claim 12, wherein the first extant battery life value is read from a lookup table in dependence on said average.

14. A method according to claim 9, wherein the second extant battery life value is determined on the basis of a plurality of time-spaced battery voltage readings.

15. A method according to claim 14, wherein said second extant battery life value t calculated on the basis of three voltage readings according to the formula:

$$t = \frac{\ln\left(\frac{(\Phi - V_T)}{\xi}\right)}{\ln\alpha}$$

where:

$$\alpha = e^{\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

16. A method according to claim 12, wherein the second extant battery life value is determined on the basis of a plurality of time spaced battery voltage readings and the first of said time spaced readings is used for calculating said average.

17. A battery-powered apparatus including terminals for connections to a battery, a voltage sensor configured to sense the output voltage of a battery connected to said terminals, an indicator and a processor for controlling the indicator to indicate the extant life of a battery, connected to said terminals, in dependence on the output of the voltage sensor, wherein the processor is configured to:

(a) initially determine, over a first duration, a first extant battery life value having a first confidence level on the basis of the output of the voltage sensor;

(b) control the indicator to indicate said first battery life value;

(c) determine, over a second duration, a second extant battery life value having a second confidence level, higher than the first confidence level, on the basis of the output of the sensor; and (d) control the indicator to indicate said second battery life value after indication of said first battery life value, wherein said second duration is greater than said first duration, and said determination of said first extant battery life value is completed before said determination of said second extant battery life value is completed.

18. An apparatus according to claim 17, wherein the processor is configured to control the indicator such that the manner of indicating the second battery life value is different from the manner of indicating the first battery life value.

19. An apparatus according to claim 17, wherein the indicator is a display device.

20. An apparatus according to claim 17, wherein the processor is configured to determine the first extant battery life value on the basis of an average of a plurality of battery voltage readings.

21. An apparatus according to claim 20, including a memory storing a lookup table relating battery voltage readings to extant battery life values, wherein the processor is configured to read the first extant battery life value from the lookup table in dependence on said average.

22. An apparatus according to claim 17, wherein the processor is configured to calculate the second extant battery life value on the basis of a plurality of time-spaced outputs from said voltage sensor.

23. An apparatus according to claim 22, wherein said second extant battery life value is calculated on the basis of three voltage readings according to the formula:

$$t = \frac{\ln\left(\frac{(\Phi - V_T)}{\xi}\right)}{\ln \alpha}$$

where:

$$\alpha = e^{-\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

24. An apparatus according to claim 20, wherein the processor is configured to determine the second extant battery life value is determined on the basis of a plurality of time spaced battery voltage readings and calculate said average using the first of said time spaced readings.

25. A battery-powered apparatus including terminals for connections to a battery, voltage sensor configured to sense the output voltage of a battery connected to said terminals, an indicator and a processor for controlling the indicator to indicate the extant life of a battery, connected to said terminals, in dependence on the output of the voltage sensor, wherein the processor is configured to:
(a) determine a first extant battery life value having a first confidence level on the basis of the output of the voltage sensor when the apparatus is operating in a first mode;
(b) control the indicator to indicate said first battery life value;
(c) determine a second extant battery life value having a second confidence level, higher than the first confidence level, on the basis of the output of the sensor when the apparatus is operating in a second mode; and
(d) control the indicator to indicate said second battery life value after indication of said first battery life value, wherein said second mode is characterised by a higher current demand being placed on the battery powering the apparatus than that placed on the battery by said first mode.

26. An apparatus according to claim 25, wherein the processor is configured to control the indicator such that the manner of indicating the second battery life value is different from the manner of indicating the first battery life value.

27. An apparatus according to claim 25, wherein the indicator is a display device.

28. An apparatus according to claim 25, wherein the processor is configured to determine the first extant battery life value on the basis of an average of a plurality of battery voltage readings.

29. An apparatus according to claim 28, including a memory storing a lookup table relating battery voltage readings to extant battery life values, wherein the processor is configured to read the first extant battery life value from the lookup table in dependence on said average.

30. An apparatus according to claim 25, wherein the processor is configured to calculate the second extant battery life value on the basis of a plurality of time-spaced outputs from said voltage sensor.

31. An apparatus according to claim 30, wherein said second extant battery life value is calculated on the basis of three voltage readings according to the formula:

$$t = \frac{\ln\left(\frac{(\Phi - V_T)}{\xi}\right)}{\ln \alpha}$$

where:

$$\alpha = e^{-\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

32. An apparatus according to claim 28, wherein the processor is configured to determine the second extant battery life value is determined on the basis of a plurality of time spaced battery voltage readings and calculate said average using the first of said time spaced readings.

33. A mobile telephone including terminals for connections to a battery, a voltage sensor configured to sense the output voltage of a battery connected to said terminals, an indicator and a processor for controlling the indicator to indicate the extant life of a battery, connected to said terminals, in dependence on the output of the voltage sensor, wherein the processor is configured to:
(a) initially determine, over a first duration, a first extant battery life value having a first confidence level on the basis of the output of the voltage sensor;
(b) control the indicator to indicate said first battery life value;
(c) determine, over a second duration, a second extant battery life value having a second confidence level, higher than the first confidence level, on the basis of the output of the sensor; and
(d) control the indicator to indicate said second battery life value after indication of said first battery life value, wherein said second duration is greater than said first duration, and said determination of said first extant battery life value is completed before said determination of said second extant battery life value is completed.

34. A mobile telephone according to claim 33, wherein the processor is configured to control the indicator such that the manner of indicating the second battery life value is different from the manner of indicating the first battery life value.

35. A mobile telephone according to claim 33, wherein the indicator is a display device.

36. A mobile telephone according to claim 33, wherein the processor is configured to determine the first extant battery life value on the basis of an average of a plurality of battery voltage readings.

37. A mobile telephone according to claim 36, including a memory storing a lookup table relating battery voltage readings to extant battery life values, wherein the processor is configured to read the first extant battery life value from the lookup table in dependence on said average.

38. A mobile telephone according to claim 33, wherein the processor is configured to calculate the second extant battery life value on the basis of a plurality of time-spaced outputs from said voltage sensor.

39. A mobile telephone according to claim 38, wherein said second extant battery life value is calculated on the basis of three voltage readings according to the formula:

$$t = \frac{\ln\left(\frac{(\Phi - V_T)}{\xi}\right)}{\ln \alpha}$$

where:

$$\alpha = e^{\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

40. A mobile telephone according to claim 36, wherein the processor is configured to determine the second extant battery life value is determined on the basis of a plurality of time spaced battery voltage readings and calculate said average using the first of said time spaced readings.

41. A mobile telephone including terminals for connections to a battery, voltage sensor configured to sense the output voltage of a battery connected to said terminals, an indicator and a processor for controlling the indicator to indicate the extant life of a battery, connected to said terminals, in dependence on the output of the voltage sensor, wherein the processor is configured to:

(a) determine a first extant battery life value having a first confidence level on the basis of the output of the voltage sensor when the apparatus is operating in a first mode;

(b) control the indicator to indicate said first battery life value;

(c) determine a second extant battery life value having a second confidence level, higher than the first confidence level, on the basis of the output of the sensor when the apparatus is operating in a second mode; and (d) control the indicator to indicate said second battery life value after indication of said first battery life value, wherein said second mode is characterised by a higher current demand being placed on the battery powering the apparatus than that placed on the battery by said first mode.

42. A mobile telephone according to claim 41, wherein the processor is configured to control the indicator such that the manner of indicating the second battery life value is different from the manner of indicating the first battery life value.

43. A mobile telephone according to claim 41, wherein the indicator is a display device.

44. A mobile telephone according to claim 41, wherein the processor is configured to determine the first extant battery life value on the basis of an average of a plurality of battery voltage readings.

45. A mobile telephone according to claim 44, including a memory storing a lookup table relating battery voltage readings to extant battery life values, wherein the processor is configured to read the first extant battery life value from the lookup table in dependence on said average.

46. A mobile telephone according to claim 41, wherein the processor is configured to calculate the second extant battery life value on the basis of a plurality of time-spaced outputs from said voltage sensor.

47. A mobile telephone according to claim 46, wherein said second extant battery life value is calculated on the basis of three voltage readings according to the formula:

$$t = \frac{\ln\left(\frac{(\Phi - V_T)}{\xi}\right)}{\ln \alpha}$$

where:

$$\alpha = e^{\frac{\ln\left[\frac{V_1 - V_2}{V_0 - V_1}\right]}{\Delta t}}$$

$$\xi = \frac{(V_0 - V_1)^2}{2V_1 - V_2 - V_0}$$

$$\Phi = V_0 - \frac{(V_0 - V_1)^2}{2V_1 - V_2 - V_0}$$

where $V_0$, $V_1$ and $V_2$ are the initial, middle and last voltage readings, $\Delta t$ is the time between the initial and middle voltage readings and between the middle and last voltage readings and $V_T$ is the minimum acceptable battery voltage.

48. A mobile telephone according to claim 44, wherein the processor is configured to determine the second extant battery life value is determined on the basis of a plurality of time spaced battery voltage readings and calculate said average using the first of said time spaced readings.

* * * * *